United States Patent
Hassan et al.

(10) Patent No.: US 10,422,839 B2
(45) Date of Patent: Sep. 24, 2019

(54) HF COIL ASSEMBLY

(71) Applicant: Bruker BioSpin AG, Faellanden (CH)

(72) Inventors: Alia Hassan, Binz (CH); Nicolas Freytag, Binz (CH)

(73) Assignee: BRUKER SWITZERLAND AG, Faellanden (CH)

( * ) Notice: Subject to any disclaimer, the term of this patent is extended or adjusted under 35 U.S.C. 154(b) by 307 days.

(21) Appl. No.: 15/639,380

(22) Filed: Jun. 30, 2017

(65) Prior Publication Data
US 2018/0003782 A1 Jan. 4, 2018

(30) Foreign Application Priority Data
Jul. 1, 2016 (DE) .................. 10 2016 212 018

(51) Int. Cl.
| | | |
|---|---|---|
| *G01R 33/34* | (2006.01) | |
| *G01R 33/341* | (2006.01) | |
| *G01R 33/36* | (2006.01) | |
| *G01R 33/44* | (2006.01) | |
| *G01V 3/14* | (2006.01) | |
| *G01R 33/30* | (2006.01) | |
| *G01R 33/46* | (2006.01) | |

(52) U.S. Cl.
CPC ..... *G01R 33/34046* (2013.01); *G01R 33/341* (2013.01); *G01R 33/34007* (2013.01); *G01R 33/34069* (2013.01); *G01R 33/3635* (2013.01); *G01R 33/44* (2013.01); *G01V 3/14* (2013.01); *G01R 33/307* (2013.01); *G01R 33/4608* (2013.01); *Y10S 505/844* (2013.01)

(58) Field of Classification Search
None
See application file for complete search history.

(56) References Cited

U.S. PATENT DOCUMENTS

| 4,769,602 A | 9/1988 | Vinegar et al. |
|---|---|---|
| 5,293,519 A | 3/1994 | Yoshino et al. |

(Continued)

FOREIGN PATENT DOCUMENTS

| DE | 4421759 A1 | 4/1995 |
|---|---|---|
| DE | 4434948 A1 | 4/1996 |

(Continued)

OTHER PUBLICATIONS

J. Thomas Vaughan et al., "Detection Coils for MRS", John Wiley & Sons, Ltd. Jun. 2016.

*Primary Examiner* — Jermele M Hollington
*Assistant Examiner* — Suresh K Rajaputra
(74) *Attorney, Agent, or Firm* — Edell, Shapiro & Finnan, LLC

(57) ABSTRACT

An HF coil assembly for generating independent alternating magnetic fields in an examination volume of a magnetic resonance apparatus is presented, the HF coil assembly comprising a first coil pair of saddle coils and a second coil pair of saddle coils, each saddle coil having longitudinal conductor elements and curved conductor elements arranged along a common lateral surface of a circular cylinder having a cylinder axis. Each coil pair comprises curved conductor elements and longitudinal conductor elements which are interconnected at a high frequency. The saddle coils also have diagonal conductor elements and/or bridge elements that connect the longitudinal and curved conductor elements. The coil pairs are opposite to each other relative to the cylinder axis.

34 Claims, 1 Drawing Sheet

(56) References Cited

U.S. PATENT DOCUMENTS

| | | | |
|---|---|---|---|
| 5,602,557 A | 2/1997 | Duerr | |
| 6,317,091 B1 | 11/2001 | Oppelt | |
| 6,806,713 B2 | 10/2004 | Wong | |
| 6,828,791 B2 | 12/2004 | Morita et al. | |
| 7,884,609 B2 | 2/2011 | Soutome et al. | |
| 2007/0285096 A1 | 12/2007 | Soutome et al. | |

FOREIGN PATENT DOCUMENTS

| | | |
|---|---|---|
| DE | 19844762 A1 | 4/2000 |
| JP | S63317143 A | 12/1988 |
| JP | 2003-255032 | 9/2003 |
| JP | 2009-022483 | 2/2009 |

HF COIL ASSEMBLY

CROSS REFERENCE TO RELATED APPLICATIONS

This application claims foreign priority under 35 U.S.C. § 119(a)-(d) to German Application No. 10 2016 212 018.2 filed on Jul. 1, 2016, the entire contents of which are hereby incorporated into the present application by reference.

FIELD OF THE INVENTION

The present invention relates to a high-frequency (HF) coil assembly for generating at least two independent alternating magnetic fields in an examination volume of a magnetic resonance apparatus, comprising a first coil pair of saddle coils having longitudinal conductor elements and curved conductor elements, which are arranged along a common geometric lateral surface of a circular cylinder having a cylinder axis. In other aspects, the invention relates to a measuring probe, a magnetic resonance apparatus and a method for performing an NMR measurement using the HF coil assembly.

BACKGROUND

NMR spectroscopy (NMR stands for nuclear magnetic resonance, nuclear spin resonance) is an instrumental analysis method, in which it is possible to determine, in particular, the chemical composition of samples. In this process, high-frequency pulses are irradiated into the sample, which is located in a strong, homogeneous static magnetic field $B_0$, and the electromagnetic reaction of the sample is measured. In solid-state NMR spectroscopy, the sample is rotated about an axis of rotation at a high speed to reduce the line broadening caused by anisotropic interactions. To this end, the axis of rotation is tilted at the "magic angle" of $\theta_m = \arccos(\sqrt{1/3}) \approx 54.74°$ to the homogenous static magnetic field. This measuring technique is commonly referred to as "magic angle spinning" (MAS). The angle $\theta_m$ is a solution to the second-order Legendre polynomial $P_2(\cos(\theta_m))=0$, and so all interactions that depend upon this Legendre polynomial are averaged out over time during rotation about an axis at this angle to the magnetic field. This is the case for three important interactions in the substance: bipolar coupling, chemical shift anisotropy and first-order quadrupole interaction. Since the crystal directions of individual crystallites for non-single crystal samples are random relative to the static field, the interaction is cancelled out by the sufficiently fast rotation of the sample at the magic angle. In this way, line broadening caused by these interactions can be reduced significantly, ideally as far as the natural line width.

MAS-NMR measuring probes permit the use of high-resolution NMR spectroscopy on solid, powdery or semi-solid (gelatinous or pasty) sample substances. The sample is loaded into a circular cylindrical sample container, i.e. the rotor, which, during the measurement, is rotated using compressed gases in a stator to very high speeds at a rotation frequency in the range of a few KHz to over a hundred KHz. The radial bearing is secured by air bearings in the stator while a retaining force generated by air flow retains the rotor in its axial position in the stator.

The sample is surrounded by at least one transmitter and/or receiver coil, in which high-frequency (HF) alternating magnetic fields $B_{1i}$ can be irradiated into the measuring volume; the frequency $\omega_i$ of said alternating fields is adapted to the resonance frequency of a core in the static magnetic field $B_0$. Usually, measuring probes are designed such that at least two different frequencies can be transmitted and received.

Many solid-state NMR experiments utilize cross polarization (CP) to increase sensitivity. CP is a standard NMR technique for reinforcing and allocating NMR lines, in which rare spins S (e.g. spins of $^{13}C$ nuclei) are coupled to common spins I (e.g. spins of $^1H$ nuclei). In addition, two alternating magnetic fields $B_{1I}$ and $B_{1S}$, each having the resonance frequency $\omega_I$ and $\omega_S$ of the respective spins, are irradiated onto the sample at the same time, where the two alternating magnetic fields also at least approximately satisfy the Hartmann-Hahn condition (HHC). The HHC is satisfied when the intensities of the spinlock fields $B_{1I}$ and $B_{1S}$ fulfill the condition $\gamma_I B_{1I} = \gamma_S B_{1S}$, $\gamma_I$ and $\gamma_S$ being the gyromagnetic ratios of the respective nuclear spins. An optimal polarization transfer is then possible between the two nucleus types I and S by J cross polarization. CP is a double-resonance experiment that is mostly carried out between $^1H$ (I) and $^{13}C$ (S).

In solids, the signal of S is strengthened by cross polarization in that I is retained for a contact period in the spinlock (spinlocking), S is brought to saturation and the "hot" and "cold" spins couple (spin temperature) such that a magnetization transfer occurs. In doing so, the common nucleus I is excited and its energy is transferred to the detected nuclear spin S by applying a low-power RF pulse to both channels. The HF power of these two pulses must be set such that the transition energy for both nuclei is the same. For the example of the $^1H$ $^{13}C$ polarization transfer, the high-frequency magnetic field $B_1$ must be of the order of four times weaker for the proton channel than for the carbon channel. The efficiency of the polarization transfer is highly dependent upon satisfying the Hartmann-Hahn condition. In particular, it is important that the Hartmann-Hahn condition be satisfied at as many points as possible in the measuring volume within a tolerance range, which depends upon various experimental parameters, inter alia the MAS rotation frequency.

One experiment with an especially narrow tolerance range for fulfilling the HHC, which holds great significance in the solid-state NMR of biological substances, is the double CP experiment (DCP). In this experiment, two CP steps are carried out in succession. Usually, the polarization of the protons is transferred to an X nucleus in a first step (to increase sensitivity), and transferred to a different (Y) nucleus in a second step in order to determine the dipolar coupling between X and Y nuclei. The sequence of the transfer is arbitrary in principle, but it normally proceeds from $^1H$ to $^{15}N$ and finally to $^{13}C$, which is ultimately detected.

The tolerance ranges of the HHC for this experiment are extremely tight, and so it is necessary to perform an exact calibration of the $B_{1i}$ field strengths. Furthermore, the efficiency is extremely dependent upon all three $B_{1i}$ fields involved interacting appropriately, in particular the alternating magnetic fields for exciting the $^{15}N$ and $^{13}C$ nuclei in the measuring volume.

Generally, NMR measuring probes are employed in superconducting NMR magnet systems, in which the homogeneous static magnetic field $B_0$, which defines the z axis of the laboratory coordinate system, is oriented along a "bore".

The samples to be analyzed, consisting of liquid, powdery, gelatinous substances, but also tissue samples, single crystals, glasses or mixtures of different substances, are usually loaded into cylindrical, in particular circular cylindrical, containers. This sample container is inserted into a recess in the measuring probe provided for receiving samples. The cylinder axis of the sample container is usually either parallel, orthogonal or at the magic angle $\theta_m$=arccos $(\sqrt{1/3})\approx 54.74°$ to $B_0$. The samples are surrounded by generally cylindrical RF coil assemblies, which usually consist of saddle coils, solenoid coils and/or resonators, birdcage resonators and Alderman-Grant resonators in particular being used.

It is conventional during an NMR experiment to employ the same coil to excite the nuclear spins, i.e. as a transmitter coil, and to detect signals in a later phase of the NMR experiment, i.e. as a receiver coil. In so doing, the corresponding HF paths of the NMR spectrometer are correspondingly switched from an HF transmitter to a preamplifier and HF receiver. Corresponding switching devices are known.

Based on the extremely small signals that are measured during NMR experiments, the sensitivity in the detection phase often has an especially high importance during the design of a coil assembly. An NMR measuring probe usually has one and optionally two preferred measuring frequencies that are used for detection. Further measuring frequencies are utilized primarily for transmitting decoupling pulses and for polarization transfers. In order to permit multiple transmission or reception frequencies to be operated simultaneously, two coil assemblies that lie radially inside each other are generally used. At least one of the detection measurement frequencies is applied to the inner coil assembly, and an attempt is made to minimize the losses of these coil assemblies. This results in the optimization of the sensitivity of the measuring probe during detection.

Measuring probes in which multiple resonance frequencies are tuned on a single detection coil are conventional particularly in solid-state NMR, although this results in significant losses in performance when more than two resonance frequencies are involved. Satisfying a number of boundary conditions leads to significant losses in the performance of CP experiments, in particular of DCP experiments.

An NMR measuring probe is known from U.S. Pat. No. 6,806,713 B2, which employs as many as three coils, which are arranged coaxially with a MAS axis of rotation, at least two of said coils being tuned to the same measurement frequency and operated in quadrature. A measuring probe of this type minimizes the power required to generate broadband RF pulses and maximizes sensitivity for the detection of the measuring channel operated in quadrature. The coil assembly in this measuring probe solves the problem that only the components of the alternating magnetic fields standing perpendicularly to the static magnetic field are effective for the excitation of the nuclear spins and that the alternating magnetic fields to be received are likewise perpendicular to the static magnetic field. The coils according to U.S. Pat. No. 6,806,713 B2 are interconnected and operated such that the alternating magnetic fields generated thereby add up to an alternating magnetic field with a large active component, and/or said coils optimally detect the alternating magnetic fields generated by the nuclear spins in the receiving phase of an NMR experiment.

The problem of cross polarization efficiency remains unsolved in the aforementioned coil assembly, in particular the problem of cross polarization efficiency in DCP experiments. For this reason, a solution such as the one presented in U.S. Pat. No. 6,806,713 B2 does not constitute a maximization of the measuring probe sensitivity for realistic experiments.

An alternative HF coil assembly for generating at least two independent alternating magnetic fields in an examination volume of a magnetic resonance apparatus which overcomes a disadvantage associated with the prior art is provided herein. In particular, an HF coil assembly having high cross polarization efficiency (CP efficiency) is provided herein.

SUMMARY

This problem is solved by the HF coil assembly according to the independent claim or claims. A HF coil assembly according to one aspect of the invention generates at least two independent alternating magnetic fields in an examination volume of a magnetic resonance apparatus. Said coil assembly comprises two coil pairs consisting of saddle coils, each having longitudinal conductor elements and curved conductor elements that are arranged along a common geometric lateral surface of a circular cylinder having a cylinder axis. A first group of curved conductor elements and longitudinal conductor elements are interconnected at a high frequency to form the first coil pair with saddle coils, which are opposite each other relative to the cylinder axis. Moreover, a second group of curved conductor elements and longitudinal conductor elements are interconnected at a high frequency to form the second coil pair with saddle coils, which are opposite each other relative to the cylinder axis. The axial position and extent relative to the cylinder axis of the first and second coil pairs are equal. The first and second coil pair overlap in the azimuthal direction, and the saddle coils of the first and/or second coil pair comprise bridge elements, each of which crosses over a conductor element of the other coil pair.

The HF coil assembly according to this aspect of the present invention can be constructed cost-effectively and with simple, readily available technical resources. Because a high-frequency electric signal is applied to each of the two coil pairs in the HF coil assembly, the HF coil assembly permits two independent high-frequency alternating magnetic fields to be generated in one measuring volume, and these alternating magnetic fields result in higher cross polarization efficiency when they are irradiated onto the sample at the same time.

The inventors have recognized in the HF coil assembly according to the invention that the two alternating magnetic fields generated by the two coil pairs have field strength distributions that are largely proportional to each other in the measuring volume. As a result, using an adjustment to the ratio of transmission powers, such that the HHC is satisfied for one point in the measuring volume, the HHC is satisfied in the entire measuring volume with only a minor deviation. Or in other words: the field strength distribution of the alternating magnetic field generated by the first coil pair in its three-dimensional form and position matches the field strength distribution of the alternating magnetic field generated by the second coil pair. Field strength distribution is understood to be the positional dependence of the amplitudes of the alternating magnetic fields.

The alternating magnetic fields, which can be generated independently of each other, can differ from each other by different frequencies or different phase positions, for example. In particular, largely identical field strength distributions can be achieved for the two alternating magnetic fields in the measuring volume, even when there are two different transmission frequencies, without having to accept substantial losses in the performance of the measuring probe for other parameters.

In one embodiment of the HF coil assembly, at least one of the bridge elements is designed as an electrically conductive element. Bridge elements of this type can be designed, for example, as bonding wire or as curved sheet metal.

In one embodiment of the HF coil assembly, at least one of the bridge elements is designed as a capacitor, in particular as a ceramic multilayer capacitor chip.

In one embodiment of the HF coil assembly, at least one coil pair comprises diagonal conductor elements, which are extended along a helical line on the lateral surface. Diagonal conductor elements can connect longitudinal conductor elements to curved conductor elements, for example.

In one embodiment of the HF coil assembly, bridge elements of the one coil pair, which are preferably arranged diagonally, cross over diagonal conductor elements of the other coil pair in each case. This embodiment permits a compact arrangement of the crossing points.

In one embodiment of the HF coil assembly, curved conductor elements of the first coil pair and curved conductor elements of the second coil pair are oriented axially toward each other.

In one embodiment of the HF coil assembly, the azimuthal opening angle of the saddle coils of at least one coil pair is between 100° and 140°, in particular 120°. In the case of coils having multiple windings, the current concentration of adjacent conductors should be taken into account to determine the azimuthal opening angle. At the same time, spatially uniform, i.e. homogeneous, distributions of the generated alternating magnetic fields are achieved as a result of the high CP efficiency in this embodiment. Generally, an azimuthal opening angle selected to be close to the 120° angle, e.g. in a range of between 110° and 130° or between 115° and 125°, leads to better homogeneity and higher CP efficiency.

In one embodiment of the HF coil assembly, the coil pairs are arranged such that they are rotated 90° to each other about the cylinder axis. In this embodiment, an HF decoupling of the coil pairs can be achieved using the geometric arrangement of the two coil pairs.

In one embodiment of the HF coil assembly, the conductor elements of the first coil pair and of the second coil pair are the same shape and are arranged in the same shape. In a manner of speaking, in this embodiment, the curved conductor elements, the longitudinal conductor elements and, in any case, the diagonal conductor elements of the second coil pair are an azimuthally rotated copy of the corresponding conductor elements of the first coil pair.

In a further embodiment, the HF coil assembly is arranged on a coil support comprising an outer surface, which is identical in portions to the geometric lateral surface of the circular cylinder. The conductor elements can be produced, for example by structuring, e.g. etching, a metal coating of the coil support. The coils can also simply rest on the coil support.

In one embodiment of the HF coil assembly, the coil support comprises at least one of the following materials: sapphire, glass, quartz, a fluoropolymer, in particular polytetrafluoroethylene, a ceramic, in particular alumina, magnesium oxide or boron nitride. In this embodiment, the dielectric loss of the coil assembly is kept at a minimum, which contributes to high sensitivity when signals are received.

In one embodiment of the HF coil assembly, the saddle coils are dimensionally stable, self-supporting coils. No coil support is required in this embodiment, and either more measuring volume is available in the interior of the coil assembly or volume for additional coils is available.

In one embodiment of the HF coil assembly, said HF coil assembly additionally comprises a solenoid coil having an axial direction that is coaxial with the cylinder axis. In this embodiment, a third coil is available, in which a third alternating magnetic field can be generated. This embodiment permits double CP experiments. The solenoid coil can have a larger or smaller radius than the radius of the circular cylinder, on the lateral surface of which the two saddle coil pairs are arranged.

In one embodiment of the HF coil assembly, the two coil pairs are designed to generate alternating magnetic fields at two different frequencies. By using capacitive components, the coil pairs can be designed as resonant structures. The number of windings, coil dimensions and capacitance values are selected such that a resonant mode with homogeneous field distribution in the provided measuring volume corresponds in frequency to the NMR resonance frequency of a desired nuclear spin. For instance, one coil pair can be designed for the $^1$H frequency and the other for the $^{13}$C frequency.

In one embodiment of the HF coil assembly, the two saddle coils are connected in series in at least one coil pair.

In one embodiment of the HF coil assembly, the two saddle coils are connected in parallel in at least one coil pair.

In a further aspect, the invention relates to a measuring probe comprising an HF coil assembly according to the invention.

In one embodiment, the measuring probe has at least two HF inputs, a first HF input being coupled at a high frequency to the first coil pair via a first tuning network, and a second HF input being coupled at a high frequency to the second coil pair via a second tuning network. This embodiment allows for high-frequency adaptation of the individual HF channels, in particular even each time the sample is exchanged in the measuring volume.

In one embodiment of the measuring probe, at least one of the tuning networks is connected to the relevant coil pair via at least one serial capacitive element.

In one embodiment of the measuring probe, at least one of the tuning networks is coupled to the relevant coil pair in a galvanically isolated, in particular transformational, way. In this embodiment, the HF connection to the coil pair is achieved using inductively coupled coils, one or both saddle coils, or alternatively an additional coil, on the coil pair side being able to act as a coupling partner for the tuning network.

In one embodiment of the measuring probe, the HF coil assembly additionally comprises a solenoid coil having an axial direction that is coaxial with the cylinder axis. In this embodiment, a third coil is available, in which a third alternating magnetic field can be generated. This embodiment of the measuring probe permits double CP experiments.

In one embodiment, the measuring probe comprises at least one pivot bearing having an axis of rotation that is coaxial with the cylinder axis, the at least one pivot bearing being designed to provide rotary support for a sample within the HF coil assembly. These pivot bearings can be designed as pneumatic bearings, for example, in particular as Bernoulli bearings.

In a further aspect, the invention relates to a magnetic resonance apparatus comprising an HF coil assembly according to the invention or comprising a measuring probe according to the invention.

In one embodiment, the magnetic resonance apparatus comprises a device for generating a static magnetic field in a magnetic field direction in the examination volume of the magnetic resonance apparatus and an arrangement for positioning the measuring probe at a predetermined angle to the static magnetic field.

In one embodiment of the magnetic resonance apparatus, the cylinder axis is arranged parallel to the magnetic field direction. When in operation, the two coil pairs in this embodiment generate alternating magnetic fields, the main components of which are oriented perpendicularly to the static magnetic field in the interior of the coil assembly, i.e. in the measuring volume. In this way, high efficiency during transmission and high sensitivity during detection are achieved.

In one embodiment of the magnetic resonance apparatus, the cylinder axis is arranged at an angle of between 50° and 60°, in particular between 54.7° and 54.8°, to the direction of the magnetic field. This is the embodiment for MAS-NMR. The magnetic resonance apparatus can also comprise methods of finely adjusting the magic angle, for example.

In one variant of this latter embodiment of the magnetic resonance apparatus, the coil axis of the first coil pair and the coil axis of the second coil pair intersect with the plane spanned by the magnetic field direction and the cylinder axis, in each case at an angle of between 40° and 50°, in particular at an angle of 45°. This embodiment has the property that the two coil pairs generate a largely equal share of the active components of the alternating magnetic field.

In one embodiment of the magnetic resonance apparatus, the first and second coil pairs are each operatively coupled to a first and a second HF transmitting unit and can be independently controlled. In this embodiment, temporally pulsed alternating magnetic fields can be induced in the interior of the HF coil assembly by appropriately activating the operative connection between the HF transmitting units and the corresponding coil pair.

In a further aspect, the invention relates to a method for performing an NMR measurement. The NMR measurement is carried out on a sample, and a HF coil assembly according to the invention is used in this method. The method comprises the steps:

the sample is arranged within the lateral surface of the cylinder of the HF coil assembly, and
HF power is applied to both coil pairs of the HF coil assembly simultaneously.

Terms

Hereafter, definitions will be provided for important terms as they are used in the present description and in the claims.

On a circular cylinder, a direction parallel to the cylinder axis is referred to as an axial direction, a direction along a perimeter of the lateral surface of the circular cylinder as an azimuthal direction and a direction toward or away from the axis as a radial direction. Positions, extents and angles are similarly referred to as axial, azimuthal and radial.

A direction on the lateral surface that corresponds to a combination of axial and azimuthal directions, i.e. that lies on a helical line in the direction of a local tangent on the lateral surface, is referred to as diagonal.

A coil is understood to be a continuous electrical conductor or a resonant structure having conductor portions and capacitive portions and components, and is arranged around a region in at least one winding.

A saddle coil is understood to be a coil that is arranged along the perimeter of an imaginary surface that is curved over a cylinder wall. This surface can be rectangular in shape when flattened, for example, but this surface can also be any kind of polygon or can have rounded corners. When there are wide strip conductors or multiple windings, the current concentration on a strip conductor or the current concentration of adjacent conductor elements of multiple windings should be taken into account to determine a position or a dimension of the coil.

A curved conductor element is a conductor element that runs along a periphery of a circular cylinder and is extended substantially azimuthally.

A longitudinal conductor element is a conductor element that runs along a lateral surface of a circular cylinder and is extended substantially axially.

A diagonal conductor element is a conductor element that runs along a lateral surface of a circular cylinder and is extended substantially diagonally in the sense defined above.

A solenoid coil is understood to be a coil, the windings of which run substantially in the shape of a helical line with a slight incline along a lateral surface of a cylinder.

The term axis of the coil is understood to mean an axis through the region around which the windings of the coil are arranged and relative to which a winding direction of the coil is defined. In the case of a solenoid coil, the axis of the coil is the cylinder axis. In the case of a saddle coil, the axis of the coil is perpendicular to the cylinder axis. A magnetic field generated by the energized coil is oriented in the center of the coil approximately along the axial direction of the axis of the coil.

BRIEF DESCRIPTION OF THE DRAWINGS

Embodiments of the present invention are described in greater detail below with reference to the figures, in which.

DETAILED DESCRIPTION

Figure 1:
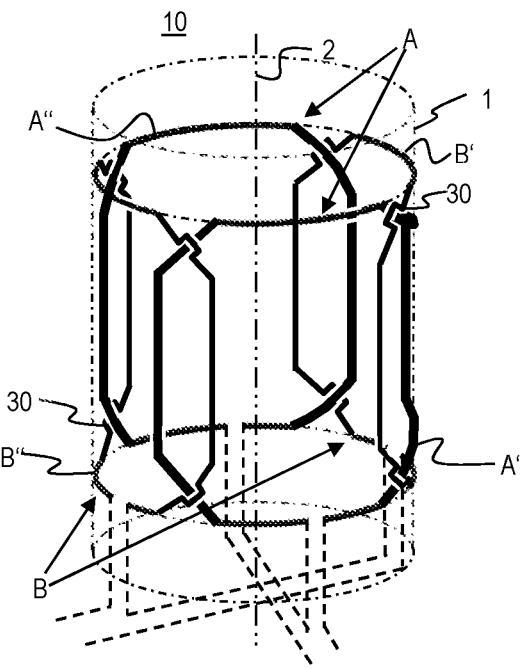
FIG. 1 is a perspective, schematic view of an HF coil assembly according to the invention.

A perspective, simplified and schematic view of an HF coil assembly 10 according to the invention is shown in FIG. 1. Conductor elements of the coil assembly are arranged along the lateral surface 1 of a circular cylinder, represented by dashed lines, having a cylinder axis 2. Longitudinal conductor elements and curved conductor elements are interconnected to form saddle coils A', A", B', B". The saddle coils A' and A" are disposed opposite each other relative to the cylinder axis and, as is schematically represented by the dashed lines, are connected to each other at a high frequency to form a first coil pair A. The saddle coils B' and B" are likewise disposed opposite each other relative to the cylinder axis and, as is schematically represented by the dashed lines, are connected to each other at a high frequency to form a second coil pair B. The coil pairs A and B have the same axial position and extent relative to the cylinder axis, which is illustrated by each of the dashed circles at the level of the curved conductor elements. The coil pairs A and B overlap in the azimuthal direction. Bridge elements 30, which cross over a conductor element of the other coil pair in each case, are arranged in the saddle coils. In the HF coil assembly shown here, a total of eight bridge elements are provided, and there are four regions on the lateral surface of the cylinder where the coil pairs overlap. The diagonally arranged bridge elements cross over the conductors of the other coil pair in places where a diagonal conductor element is located. The coil pairs A and B are drawn using different line thicknesses to make them easier to differentiate.

Figure 2A:
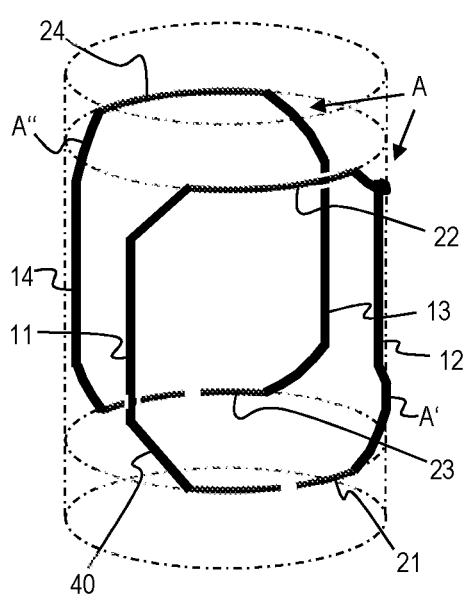
FIGS. 2A-2B shows the two coil pairs, one in FIG. 2A and the other in FIG. 2B, of the coil assembly according to FIG. 1.

FIG. 2A again shows the coil pair A from the HF coil assembly according to FIG. 1 separately and without the high-frequency connection for the sake of better visibility of the elements of said coil pair. The curved conductor elements 21 and 22 and the longitudinal conductor elements 11 and 12 are connected to the saddle coil A' by diagonal conductor elements. The curved conductor elements 23 and 24 and the longitudinal conductor elements 13 and 14 are connected to the saddle coil A" by diagonal conductor elements.

Figure 2B:
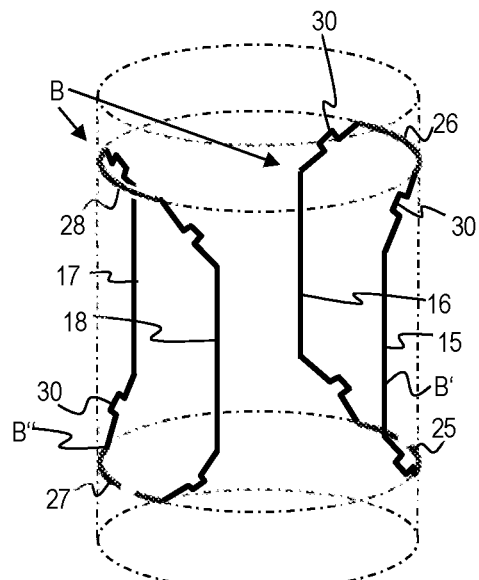

FIG. 2B again shows the coil pair B from the HF coil assembly according to FIG. 1 separately and without the high-frequency connection for the sake of better visibility of the elements of said coil pair. The curved conductor elements 27 and 28 and the longitudinal conductor elements 17 and 18 are connected to the saddle coil B' via bridge elements 30. The curved conductor elements 25 and 26 and the longitudinal conductor elements 15 and 16 are connected to the saddle coil B" via a total of eight bridge elements 30.

LIST OF REFERENCE NUMERALS

1 Lateral surface (of a circular cylinder)
2 Cylinder axis
10 HF coil assembly
11, 12, 13, 14, 15, 16, 17, 18 Longitudinal conductor elements
21, 22, 23, 24, 25, 26, 27, 28 Curved conductor elements
30 Bridge element
40 Diagonal conductor element
A First coil pair
B Second coil pair
A', A", B', B" Saddle coils

What is claimed is:

1. A high frequency (HF) coil assembly for generating at least two independent alternating magnetic fields in an examination volume of a magnetic resonance apparatus, comprising:
   a first coil pair of saddle coils having first longitudinal conductor elements and first curved conductor elements, which are arranged along a common geometric lateral surface of a circular cylinder having a cylinder axis, and
   a second coil pair of saddle coils having second longitudinal conductor elements and second curved conductor elements, which are arranged along the lateral surface,
wherein a first group of the first curved conductor elements and the first longitudinal conductor elements are interconnected at a high frequency to form the first coil pair of saddle coils, with the saddle coils positioned opposite each other relative to the cylinder axis,
wherein a second group of the second curved conductor elements and the second longitudinal conductor elements are interconnected at a high frequency to form the second coil pair of saddle coils, with the saddle coils positioned opposite each other relative to the cylinder axis,
wherein the axial position and extent relative to the cylinder axis of the first coil pair and the second coil pair are equal,
wherein the first coil pair and the second coil pair overlap in an azimuthal direction, and
wherein bridge elements are arranged in the saddle coils such that each of the bridge elements of the first coil pair crosses over a second conductor element of the second coil pair and/or each of the bridge elements of the second coil pair crosses over a first conductor element of the first coil pair.

2. The HF coil assembly according to claim 1, wherein at least one of the bridge elements is an electrically conductive element.

3. The HF coil assembly according to claim 1, wherein at least one of the bridge elements is a capacitor.

4. The HF coil assembly according to claim 1, wherein at least the first coil pair or the second coil pair comprises diagonal conductor elements, which extend along a helical line on the lateral surface.

5. The HF coil assembly according to claim 4, wherein the bridge elements of the first coil pair, which are arranged diagonally, cross over the diagonal conductor elements of the second coil pair, and/or wherein the bridge elements of the second coil pair, which are arranged diagonally, cross over the diagonal conductor elements of the first coil pair.

6. The HF coil assembly according to claim 1, wherein the curved conductor elements of the first coil pair and the curved conductor elements of the second coil pair are oriented axially toward each other.

7. The HF coil assembly according to claim 1, wherein the azimuthal opening angle of the saddle coils of at least the first coil pair or the second coil pair is between 100° and 140°.

8. The HF coil assembly according to claim 1, wherein the first coil pair and the second coil pair are rotated 90° relative to each other about the cylinder axis.

9. The HF coil assembly according to claim 1, wherein the first conductor elements of the first coil pair and the second conductor elements of the second coil pair have the same shape and are arranged in the same manner.

10. The HF coil assembly according to claim 1, wherein the HF coil assembly is arranged on a coil support comprising an outer surface, which is identical in sections to the lateral surface of the circular cylinder.

11. The HF coil assembly according to claim 10, wherein the coil support comprises at least one of the following materials: sapphire, glass, quartz, a fluoropolymer, polytetrafluoroethylene, a ceramic, an alumina ceramic, a magnesium oxide ceramic, or a boron nitride ceramic.

12. The HF coil assembly according to claim 1, wherein the saddle coils of the first coil pair and the second coil pair are dimensionally stable, self-supporting coils.

13. The HF coil assembly according to claim 1, further comprising a solenoid coil having an axial direction that is coaxial with the cylinder axis.

14. The HF coil assembly according to claim 1, wherein the first coil pair and the second coil pair are designed to generate alternating magnetic fields at two different frequencies.

15. The HF coil assembly according to claim 1, wherein at least the saddle coils of the first coil pair or the saddle coils of the second coil pair are connected in series.

16. The HF coil assembly according to claim 1, wherein at least the saddle coils of the first coil pair or the saddle coils of the second coil pair are connected in parallel.

17. A measuring probe comprising an HF coil assembly as claimed in claim 1.

18. The measuring probe according to claim 17, comprising at least two HF inputs, wherein a first of the HF inputs is coupled to the first coil pair at a high frequency via a first tuning network, and wherein a second of the HF inputs is coupled to the second coil pair at a high frequency via a second tuning network.

19. The measuring probe according to claim 18, wherein at least one of the tuning networks is connected to the corresponding coil pair via at least one serial capacitive element.

20. The measuring probe according to claim 18, wherein at least one of the tuning networks is coupled to a respective one of the coil pairs in a galvanically isolated configuration.

21. The measuring probe according to claim 17, wherein the HF coil assembly further comprises a solenoid coil having an axial direction that is coaxial with the cylinder axis.

22. The measuring probe according to claim 17, further comprising at least one pivot bearing having an axis of rotation that is coaxial with the cylinder axis, wherein the at least one pivot bearing is configured to provide rotary support for a sample within the HF coil assembly.

23. A magnetic resonance apparatus comprising a measuring probe, wherein the measuring probe comprises an HF coil assembly according to claim 1.

24. The magnetic resonance apparatus according to claim 23, defining an examination volume and comprising:
   a device configured to generate a static magnetic field in a magnetic field direction in the examination volume of the magnetic resonance apparatus, and
   an arrangement for positioning the measuring probe at a predetermined angle to the static magnetic field.

25. The magnetic resonance apparatus according to claim 24, wherein the cylinder axis is arranged in parallel to the magnetic field direction.

26. The magnetic resonance apparatus according to claim 24, wherein the cylinder axis is arranged at an angle of between 50° and 60° to the direction of the magnetic field.

27. The magnetic resonance apparatus according to claim 26, wherein a coil axis of the first coil pair and a coil axis of the second coil pair intersect with the plane spanned by the magnetic field direction and the cylinder axis at an angle of between 40° and 50°.

28. The magnetic resonance apparatus according to claim 23, wherein the first coil pair and the second coil pair are each operatively coupled respectively to a first HF transmitting unit and a second HF transmitting unit and are controlled independently of one another.

29. A method for performing an NMR measurement on a sample using a coil assembly according to claim 1, wherein
   the sample is arranged within the lateral surface of the cylinder, and
   HF power is applied to both the first coil pair and the second coil pair simultaneously.

30. The HF coil assembly according to claim 3, wherein the capacitor is a ceramic multilayer capacitor chip.

31. The HF coil assembly according to claim 7, wherein the azimuthal opening angle is 120°.

32. The measuring probe according to claim 20, wherein at least one of the tuning networks is coupled to a respective one of the coil pairs in a transformational configuration.

33. The magnetic resonance apparatus according to claim 26, wherein the cylinder axis is arranged at an angle of between 54.7° and 54.8° to the direction of the magnetic field.

34. The magnetic resonance apparatus according to claim 27, wherein the coil axis of the first coil pair and the coil axis of the second coil pair intersect with the plane spanned by the magnetic field direction and the cylinder axis at an angle of 45°.

* * * * *